United States Patent
Lu et al.

(10) Patent No.: US 7,052,810 B2
(45) Date of Patent: May 30, 2006

(54) METHOD OF CORRECTING OPTICAL PROXIMITY EFFECT OF CONTACT HOLES

(75) Inventors: Tsan Lu, Taipei (TW); Wen-Bin Wu, Taoyuan (TW); Yung-Long Hung, Taipei (TW); Cheng-Kung Lu, Taipei (TW)

(73) Assignee: Nanya Technology Corporation, Taoyuan (TW)

( * ) Notice: Subject to any disclaimer, the term of this patent is extended or adjusted under 35 U.S.C. 154(b) by 54 days.

(21) Appl. No.: 10/871,755

(22) Filed: Jun. 18, 2004

(65) Prior Publication Data
US 2005/0003284 A1    Jan. 6, 2005

(30) Foreign Application Priority Data
Jul. 3, 2003    (TW) ............................... 92118168 A

(51) Int. Cl.
*G01F 9/00*    (2006.01)
(52) U.S. Cl. ........................................................... 430/5
(58) Field of Classification Search .................. 430/5, 430/296; 716/19–21
See application file for complete search history.

(56) References Cited

U.S. PATENT DOCUMENTS 6,420,077 B1 *    7/2002    Chen et al. .................... 430/30

\* cited by examiner

*Primary Examiner*—S. Rosasco
(74) *Attorney, Agent, or Firm*—Quintero Law Office

(57) ABSTRACT

A method of correcting optical proximity effect of contact holes. Corresponding relations between mask critical dimensions (mCDs) and photoresist critical dimensions (pCDs) for each pitch (d) are formed. Correction of each mCD for each combination of pCDs and pitches is determined based on the corresponding relations. The correction is used first to correct each contact hole of a processing mask pattern. The first corrected contact hole of the processing mask pattern is corrected again to a square having the same area as the first corrected contact hole and the same center as the uncorrected contact hole.

12 Claims, 5 Drawing Sheets

METHOD OF CORRECTING OPTICAL PROXIMITY EFFECT OF CONTACT HOLES

BACKGROUND OF THE INVENTION

1. Field of the Invention

The present invention relates to an exposure method of photolithography, and particularly to a method of correcting optical proximity effect of contact holes.

2. Description of the Related Art

Photolithography is a process for transferring patterns on a photo mask to a photoresist layer on a wafer. With the rapid increase of the numbers of layers in a semiconductor integrated circuit, the photolithography pattern width is critical. Similarly, because the pitches among semiconductor components are shorter, the size of a transparent region of a photo mask is smaller accordingly. The pitch of a semiconductor component, however, is limited physically by the optical characteristics thereof during an exposure process. Particularly during the development process for forming contact holes, the high-level diffraction produced interfere causes among contact target areas.

This, the optical proximity effect from contact holes is important when design rules are smaller. Although the size of contact holes on a photo mask is constant, the hole patterns densities are different. Contact holes uniformity is thus affected.

One difficulty in correcting the optical proximity effect of contact holes is that the contact holes cannot be corrected individually according to the pattern density. Although some methods can execute correction according to different pitches, the correction of each side of a contact hole may cause the center of a contact hole to shift, producing overlap problems. Moreover, adjacent hole patterns may shift drastically, causing the contact holes to merge after correction.

SUMMARY OF THE INVENTION

It is therefore an object of the present invention to provide a method for correcting optical proximity effect of contact holes.

Another object of the present invention is to provide a correction method according to pattern densities.

Yet another object of the present invention is to provide a method for forming same-sized contact holes.

To achieve the above objects, the present invention provides a method for correcting optical proximity effect of contact holes. First, corresponding relationships of mask critical dimensions (mCDs) and photoresist critical dimensions (pCDs) for each pitch are established using a test photo mask and a testing photoresist layer on a test wafer. Next, correction of the mCD for each combination of the pCDs and the pitches are determined according to corresponding relationships. A first correction is then executed for each side of the contact holes of a processing mask pattern based on the correction. The contact holes of the processing mask pattern are corrected secondly to squares having the same areas as the first corrected contact holes and the same centers as the uncorrected contact holes.

The corresponding relationships of mCDs and pCDs for each pitch are accomplished by the following steps. First, a test photo mask is provided. First hole patterns are formed on the test photo mask and the first hole patterns are combinations of pitches and mCDs. Next, an exposure and development process is executed on a test photoresist layer using the test photo mask to form second hole patterns corresponding to the first hole patterns. Subsequently, pCDs of the second hole patterns on the testing photoresist layer are measured.

The test photo mask can be divided into several regions. Each region corresponds to a first hole pattern and comprises holes arranged in a matrix. The holes have a designated mCD and a designated pitch therein.

The mentioned second correction is accomplished by the following steps. First, corresponding relationships of an area and actual mCDs are established. The area is a region of a mCD corresponding to a designated pCD. Next, the first corrected contact holes of the processing mask pattern are then corrected according to the corresponding relationships.

The contact hole region of the processing mask pattern is a transparent region and the region beyond the contact holes is an opaque region or a semi-transparent region.

Furthermore, a method for manufacturing a contact hole processing mask is provided. A test photo mask is first provided. First hole patterns are formed on the test photo mask and the first hole patterns are combinations of pitches and mCDs. An exposure and development process is then executed on a test photoresist layer using the test photo mask to form second hole patterns corresponding to the first hole patterns. Next, pCDs of the second hole patterns on the test photoresist layer are measured. Sequentially, correction of the mCD for pCD and pitch combination is determined. First corresponding relationships of an area and actual mCDs are established. The area is a region of a mCD corresponding to a designated pCD. Thereafter, a first and a second correction for sides of the contact holes of a processing mask pattern are executed based on the correction of the mCDs. After the first and the second corrections, a processing mask pattern comprising contact holes as squares of the same area as actual mCDs and the same centers as the uncorrected contact holes is obtained.

Moreover, the present invention provides a method for manufacturing a semiconductor device. The method utilizes the previously mentioned processing mask to execute an exposure and development process for transferring the contact holes on a processing mask to a photoresist layer.

The photoresist layer and the test photoresist layer on the semiconductor substrate comprise the same material and have the same thickness and processing conditions.

BRIEF DESCRIPTION OF THE DRAWINGS

The aforementioned objects, features and advantages of the invention will become apparent by referring to the following detailed description of the preferred embodiment with reference to the accompanying drawings, wherein.

DETAILED DESCRIPTION OF THE INVENTION

Corresponding relationships of mCDs and pCDs for different pitches are established according to predetermined photoresist processing conditions, e.g. bake temperature/bake time or development time, and exposure light source. Corresponding relationships of pitches (d) on a photo mask and correction for each side of contact holes are established accordingly with predetermined pCDs. A first correction is executed for contact holes on a processing mask based on the corresponding relationships. The first corrected contact holes are corrected second to squares having the same areas as the first corrected contact holes and having the same centers as the uncorrected contact holes. The following steps 1 to 3 are detailed steps of the present invention.

Step 1: Corresponding Relationships Establishment of mCDs and pCDs.

First, with a predetermined photoresist and a light source, corresponsing relationships of mCDs and pCDs are established.

Figure 1:
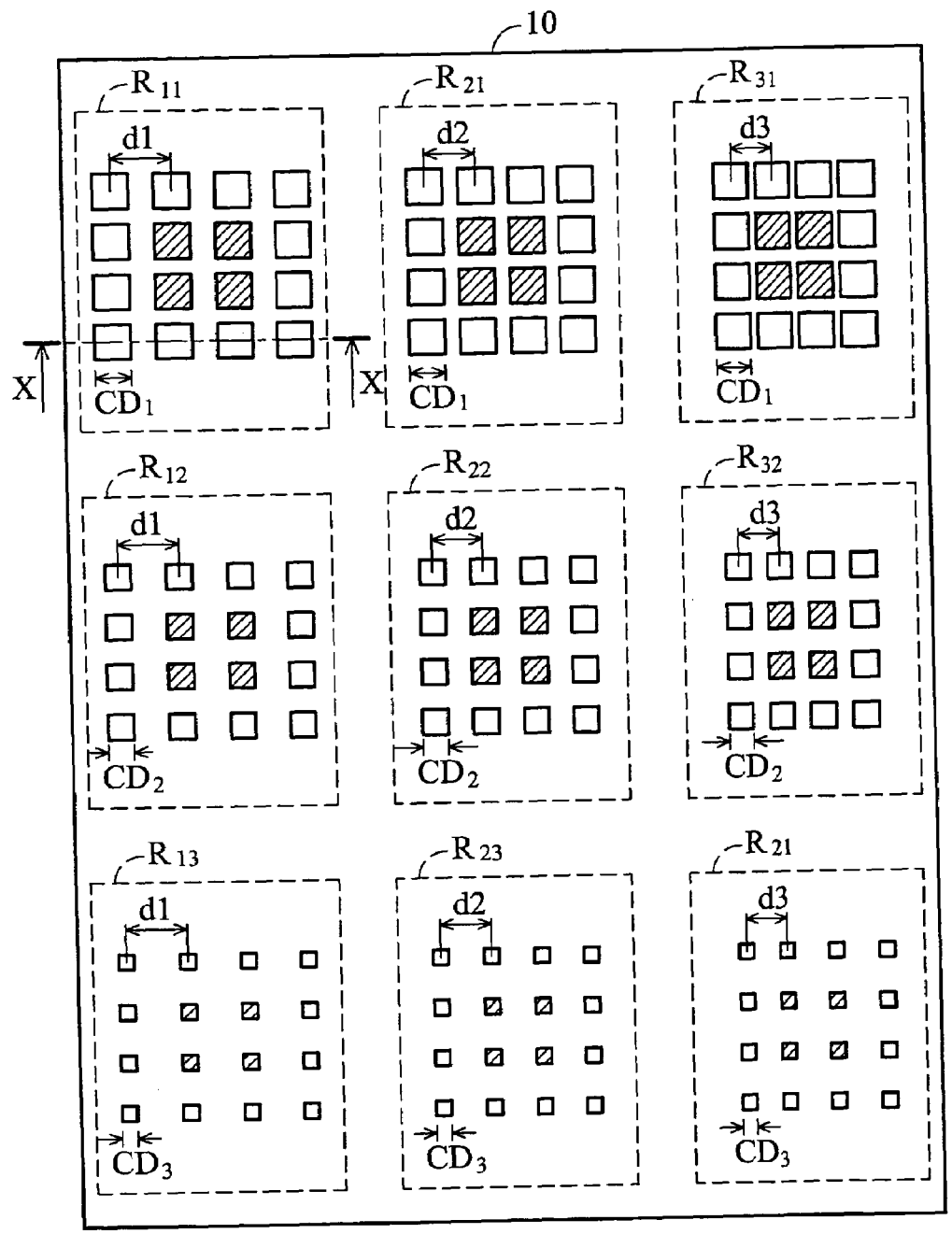
FIG. 1 is a diagram of holes on a photo mask.

FIG. 1 is a diagram of holes on a photo mask. The test photo mask 10 is divided to several regions. Each region comprises squared holes arranged in a matrix. Pitches (d) and critical dimensions (CD) are changed, that is (d, CD), as shown in FIG. 1. The parameters of the hole pattern $R_{11}$ are $(d_1, CD_1)$, the parameters of the hole $R_{12}$ are $(d_1, CD_2)$, and the parameters of the holes $R_{13}$ are $(d_1, CD_3)$. Other hole patterns, such as $R_{21}$, $R_{22}$, $R_{23}$, $R_{31}$, $R_{32}$, or $R_{33}$, are similar. The region comprising the holes is a transparent region, while the region outside the holes is an opaque region or a semi-transparent region.

Figure 2:
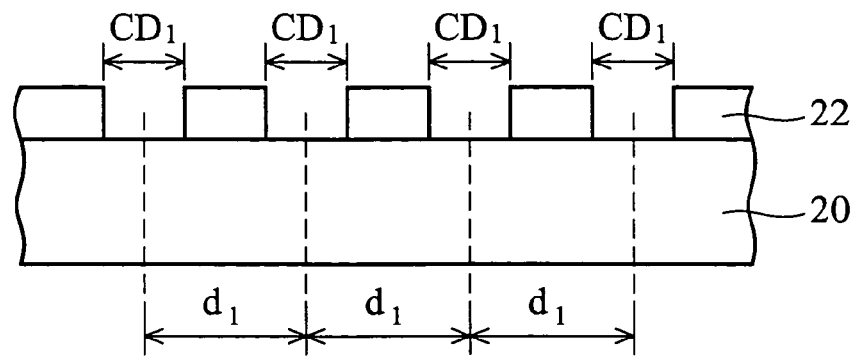
FIG. 2 is a sectional diagram along line x—x of FIG. 1.

FIG. 2 is a sectional diagram along line x—x of FIG. 1. The structure of the test photo mask 10 of FIG. 1 is shown in FIG. 2. The test photo mask 10 comprises a transparent substrate 20 and a layer 22. The layer 22 can be an opaque layer, a semi-transparent layer, or a phase shift layer. The material of the transparent layer 20 is, for example, quartz. If the layer 22 is an opaque layer, the material of the layer 22 may be Cr.

Subsequently, a test wafer is provided. The test wafer is coated with specific photoresist material of a certain thickness to form a test photoresist layer. An exposure and development process is executed using the test photo mask exposed by light source, such as deep UV, extreme UV (EUV), or x-ray, to transfer the hole patterns to the testing photoresist layer.

The dimension size critical of the holes on the photoresist layer shown in FIG. 1 are measured. The corresponding relationships of mCDs of holes on the photo mask and pCDs of holes on the photoresist layer for the different pitches are found.

It is noted that the four sides of the sliding-lined holes are allocated in the same pitch from other holes. Thus, the critical dimensions of the shaded holes on the photoresist layer, as shown in FIG. 1, are the same.

The holes on the photo mask are squares while the holes with sliding lines corresponding to holes on the photoresist layer are circles.

Figure 3:
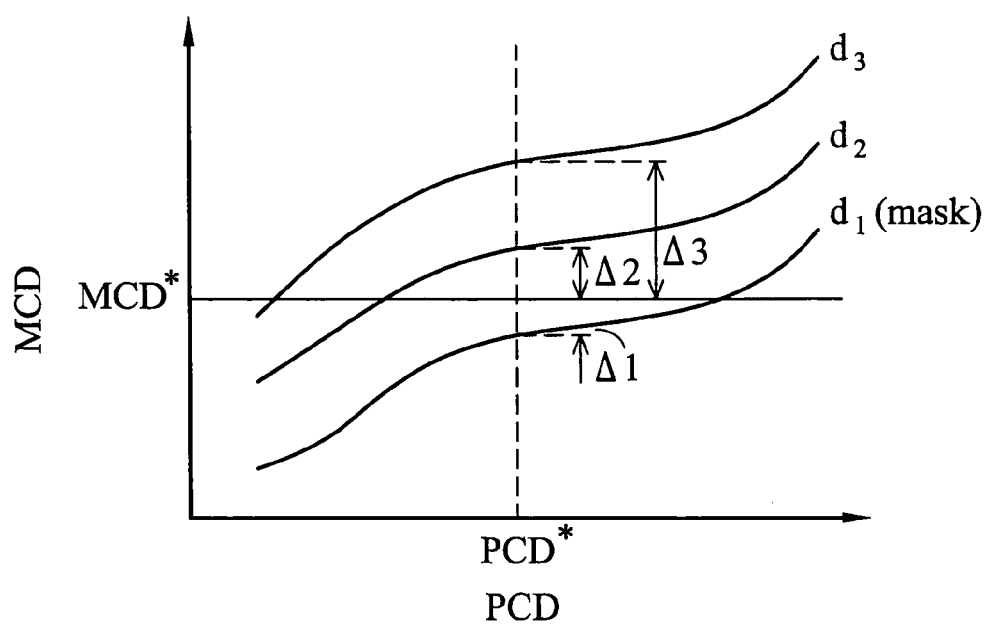
FIG. 3 is a diagram illustrating relationships of pCD and mCD.

Step 2: Corresponding Relationships Establishment of Pitches of and mCDs with Fixed pCDs If holes with a pCD are desired to be established on the photoresist layer, according to FIG. 3 produced by step 1, the mCD shift amount with a fixed pCD based on an ideal mCD for different pitches are found, as shown in Table 1.

TABLE 1

| Pitch | mCD | Correction of one side of hole patterns on a photo mask |
|---|---|---|
| $d_1$ | $-\Delta_1$ | $-\Delta_1/2$ |
| $d_2$ | $+\Delta_2$ | $+\Delta_2/2$ |
| $d_3$ | $+\Delta_3$ | $+\Delta_3/2$ |

Thus, with a predetermined pCD, according to Table 1, the holes on a photo mask are corrected according to the different pitches. For example, if mCD is regarded as the correction base and the pitch between the adjacent holes is $d_1$, the correction of the holes is $mCD+(-\Delta_1)$. If the pitch between the adjacent holes is $d_2$, the correction of the holes is $mCD+(\Delta_2)$. If the pitch between the adjacent holes is $d_3$, the correction of the holes is $mCD+(\Delta_3)$.

Figure 4:
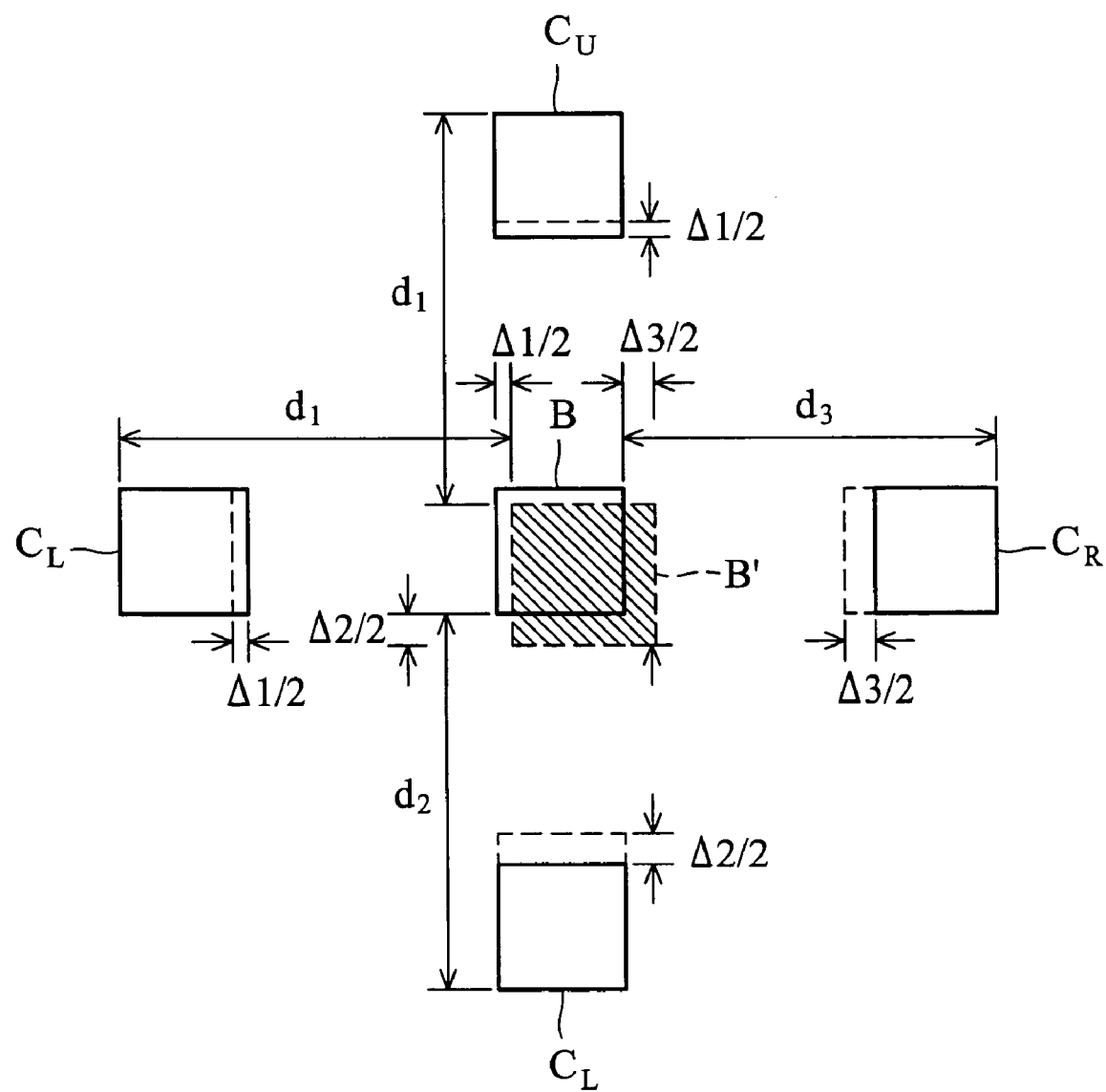
FIG. 4 is a diagram illustrating relative position of an uncorrected hole B and an adjacent first corrected hole B'.

If hole B (a b×b square) in FIG. 4 is to be corrected, the pitches for each side of the hole B corresponding to the adjacent holes ($C_L$, $C_R$, $C_U$, $C_L$) are first analyzed, that is ($d_1$, $d_2$, $d_3$, $d_4$). Subsequently, each side of hole B is corrected according to the correction in Table 1. That is, $(-\Delta_1/2)$, $(+\Delta_3/2)$, $(-\Delta_1/2)$, and $(+\Delta_2/2)$ for the left, the right, the top, and the bottom. Thus, a corrected hole B' can be produced as a $(b-\Delta_1/2+\Delta_3/2)\times(b-\Delta_1/2+\Delta_2/2)$ square.

Step 3: The First Corrected Holes are Corrected to Squares with the Same Size and Maintain the Same Centers as the Uncorrected Holes.

A second correction is necessary for maintaining the shape and the center of the hole B' when it is transferred from the photo mask to the photoresist layer on the wafer.

Figure 5:
FIG. 5 is a diagram illustrating an uncorrected hole B, a first corrected hole B', and a second corrected hole B".

The same size is maintained to obtain the same exposure length, or at least a similar exposure length. As shown in FIG. 5, a first corrected hole B' and the second corrected hole B" (a b'×b' square) have a similar size, wherein $b' \cong [(b-\Delta_1/2+\Delta_3/2)\times(b-\Delta_1/2+\Delta_2/2)]^{1/2}$, and the center of the second corrected hole B" is the same as the center M of the uncorrected hole B.

Thus, a hole B" shaped in square (b'×b') is established on the photo mask.

EXAMPLE 1

The constant parameters are described as following: the photoresist material is JSR M92Y (a type number of Japanese synthetic rubber company), the thickness is 480 nm, the bake temperature is 230° C., the bake time is 90 seconds, the exposure time is 60 seconds, and the predetermined pCD is 160 nm. The exposure light source is 248 nm and the NA is 0.68.

Subsequent to the described steps 1 and 2, the corresponding relationships of the correction for each side of the holes and the pitches of the hole patterns are established, as shown in Table 2.

TABLE 2

| Pitch(nm) | Correction of each side for hole patterns on a photo mask (mCD = 215 (nm) as a base) |
|---|---|
| 350 | +5 (nm) |
| 400 | +5 (nm) |
| 450 | 0 |
| 500 | −5 (nm) |
| 550 | −5 (nm) |
| 600 | −2.5 (nm) |
| 650 | −2.5 (nm) |

TABLE 2-continued

| Pitch(nm) | Correction of each side for hole patterns on a photo mask (mCD = 215 (nm) as a base) |
|---|---|
| 700 | 0 |
| 800 | 0 |

Figure 6:
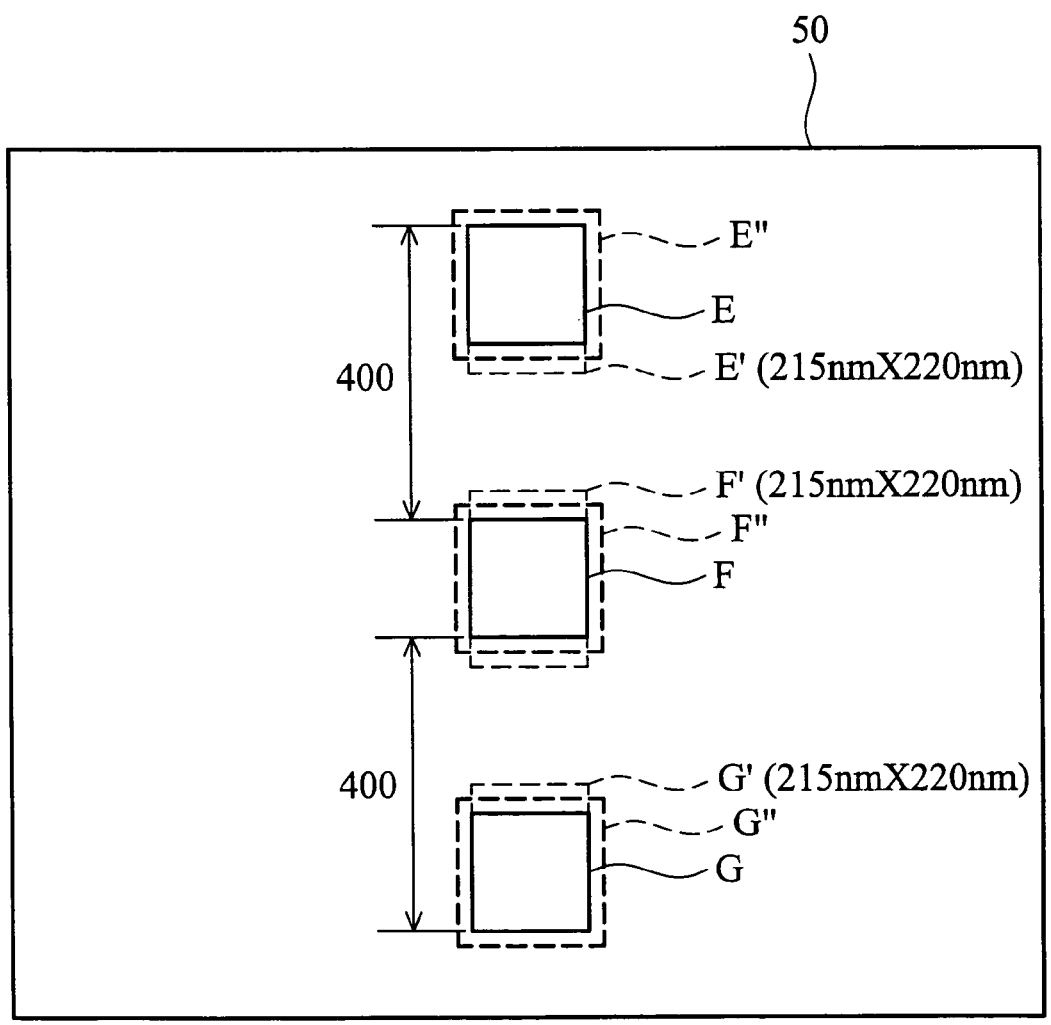
FIG. 6 is a diagram illustrating relative positions of an uncorrected hole, a first corrected hole, and a second corrected hole on a photo mask.

As shown in FIG. 6, the hole patterns are on a processing mask 50. The uncorrected holes E, F, G are 215 nm×215 nm squares. The pitch between contact holes E and F is 400 nm and the pitch between the contact holes F and G is 400 nm.

The hole patterns shown in FIG. 6 are then corrected according to Table 2. The adjacent sides of the contact holes E and F with a pitch of 400 nm are corrected to +5 nm. The adjacent sides of the contact holes F and G with a pitch of 400 nm are corrected to +5 nm. Thus, the first corrected contact holes are produced, that is E', F', and G', squares with 215 nm×220 nm, 215 nm×225 nm, and 215 nm×220 nm.

Continuing, the corrected contact holes must be corrected again to ensure the shapes and the centers are maintained when they are transferred from the processing mask 50 to the photoresist layer 60 on the wafer 70. The first corrected holes E', F', and G' are then corrected to squares of 217.5 nm×217.5 nm, 219.9 nm×219.9 nm, and 217.5 nm×217.5 nm. The centers of the second corrected holes are the same as the centers of the uncorrected holes.

Nevertheless, for simplifying the manufacturing tool for the contact holes, mCDs of the second corrected contact holes are defined as 210 nm, 215 nm, 220 nm, and 225 nm and classified according to the first corrected sizes. For example, the sizes of the first corrected contact holes are classified as the rules shown in Table 3.

TABLE 3

| The sizes of first corrected contact holes | ~45,000 | 45,000~46,700 | 46,700~48,000 | 48,000~ |
|---|---|---|---|---|
| The sizes of second corrected contact holes | 210 × 210 | 215 × 215 | 220 × 220 | 225 × 225 |

Thus, the size of the second corrected contact holes E", F", and G" are simplified as 220 nm, 225 nm, and 220 nm squares.

Figure 7:
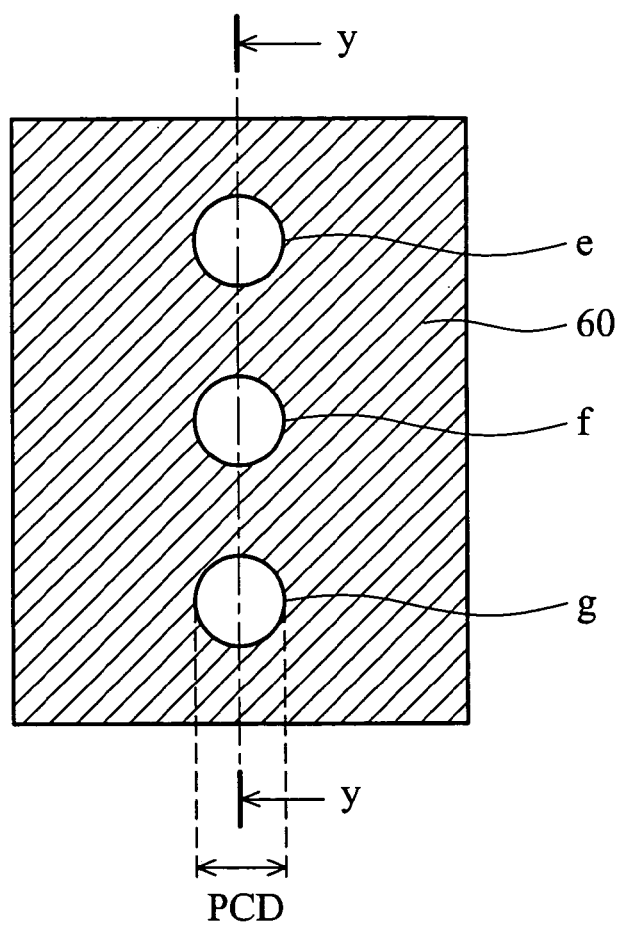
FIG. 7 is a diagram illustrating a vertical view the exposure and development of a photoresist layer using the photo mask of FIG. 6.
Figure 8:
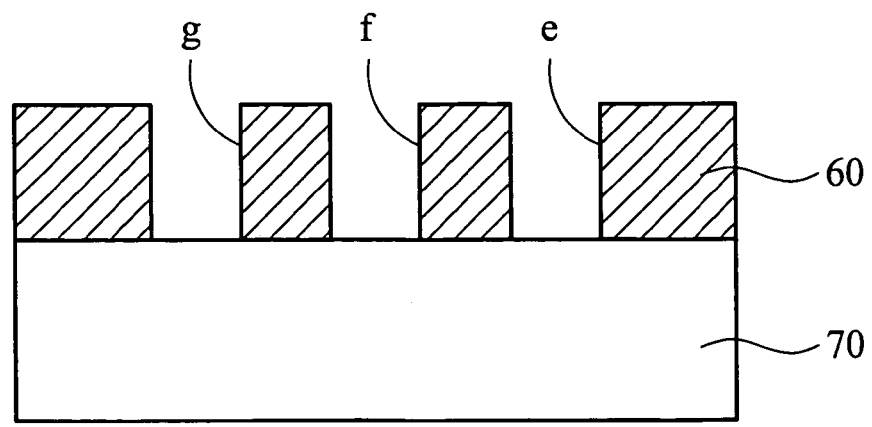
FIG. 8 is a sectional diagram along line of y—y of FIG. 7.

FIG. 8 is a sectional diagram along line of y—y of FIG. 7. The second corrected mask 50 can be used for an etching process to produce contact holes e, f, and g on the photoresist layer 60 on the wafer 70. The pCD is close to a predetermined size of 160 nm.

As a result, using the present inventive method, the corresponding pCD and mCD relationships are established according to predetermined photoresist and light source factors. According to the corresponding relationships, the relationships of the pitches (d) and the correction for each side (Δ/2) are established based on an ideal mCD. Thereafter, the hole patterns are corrected accordingly. The first and second corrections of the holes yield the same size and the same centers as the uncorrected holes.

Although the present invention has been described in its preferred embodiments, it is not intended to limit the invention to the precise embodiments disclosed herein. Those who are skilled in this technology can still make various alterations and modifications without departing from the scope and spirit of this invention. Therefore, the scope of the present invention shall be defined and protected by the following claims and their equivalents.

What is claimed is:

1. A method for optical proximity effect correction of contact holes, comprising the steps of:
    providing a test photo mask, wherein a plurality of first hole patterns are built thereon and the first hole patterns are combinations of at least one pitch and at least one mask critical dimension (mCD);
    executing an exposure and development process on a testing photoresist layer using the test photo mask to form a plurality of second hole patterns corresponding to the first hole patterns;
    measuring photoresist critical dimensions (pCDs) of the second hole patterns on the test photoresist layer;
    determining correction of the mCDs for each combination of the pCDs and the pitches;
    performing a first correction for at least one side of at least one contact hole of a processing mask pattern based on the correction of the mCDs; and
    performing a second correction of the contact hole of the processing mask pattern to a square having the same area as the first corrected contact hole and having the same center as the uncorrected contact hole.

2. The method as claimed in claim 1, wherein the test photo mask is divided to a plurality of regions, each of which corresponds to one of the first hole patterns, each hole pattern comprises a plurality of holes arranged in a matrix, and the holes have a designated mCD and a designated pitch therein.

3. The method as claimed in claim 1, further comprising the steps of:
    establishing corresponding relationships of an area and at least one actual mCD, wherein the area is a region of a mCD corresponding to a designated pCD; and
    performing a second correction for the first corrected contact holes of the processing mask pattern according to the corresponding relationships.

4. The method as claimed in claim 1, wherein the region of the contact holes of the processing mask patterns is a transparent region and the region outside the contact holes is an opaque region or a semi-transparent region.

5. A method for manufacturing a contact hole processing mask, comprising the steps of:
    providing a test photo mask, wherein at least one first hole pattern is formed thereon and the first hole patterns are combinations of at least one pitch and at least one mask critical dimension (mCD);
    executing an exposure and development process on a test photoresist layer using the test photo mask to form at least one second hole pattern corresponding to the first hole pattern;
    measuring photoresist critical dimensions (pCDs) of the second hole patterns on the test photoresist layer;
    determining correction of the mCDs for each combination of the pCDs and the pitches;
    establishing a first corresponding relationships of an area and at least one actual mCD, wherein the area is a region of a mCD corresponding to a designated pCD; and
    performing a first correction for at least one side of at least one contact hole of a processing mask pattern based on the correction of the mCDs; and
    performing a second correction of the contact holes of the processing mask pattern according to the first corresponding relation to obtain a processing mask comprising squares of the same area as the first corrected contact holes and the same centers as the uncorrected contact holes.

6. The method as claimed in claim 5, wherein the test photo mask is divided to a plurality of regions, each of which corresponds to one of the first hole patterns, each hole pattern comprises a plurality of holes arranged in a matrix, and the holes have a designated mCD and a designated pitch therein.

7. The method as claimed in claim 5, the region of the contact holes of the processing mask patterns is a transparent region and the region outside the contact holes is an opaque region or a semi-transparent region.

8. A method for manufacturing a semiconductor device, comprising the steps of:
   providing a semiconductor substrate;
   coating a photoresist layer on the semiconductor substrate;
   providing a processing mask having a plurality of contact holes, wherein the manufacture of the processing mask comprising the steps of:
      providing a test photo mask, wherein at least one first hole pattern is formed thereon and the first hole patterns are combinations of at least one pitch and at least one mask critical dimension (mCD);
      executing an exposure and development process on a test photoresist layer using the test photo mask to form at least one second hole pattern corresponding to the first hole pattern;
      measuring photoresist critical dimensions (pCDs) of the second hole patterns on the test photoresist layer;
      determining correction of the mCDs for each combination of the pCDs and the pitches;
      performing a first correction for at least one side of at least one contact hole of a processing mask pattern based on the correction of the mCDs; and
      performing a second correction of the contact holes of the processing mask pattern to obtain the processing mask, wherein the processing mask comprises squares of the contact holes, corresponding to the actual mCDs, of the same area as the first corrected contact holes and the same centers as the uncorrected contact holes; and
   transferring the contact holes on the processing mask to the photorestist layer.

9. The method as claimed in claim 8, wherein the test photo mask is divided to a plurality of regions, each of which corresponds to one of the first hole patterns, each hole pattern comprises a plurality of holes arranged in a matrix, and the holes have a designated mCD and a designated pitch therein.

10. The method as claimed in claim 8, comprising the steps of:
    establishing corresponding relationships of an area and at least one actual mCD, wherein the area is a region of a mCD corresponding to a designated pCD; and
    performing a second correction for the first corrected contact holes of the processing mask pattern according to the corresponding relations.

11. The method as claimed in claim 8, wherein the region of the contact holes of the processing mask patterns is a transparent region and the region outside the contact holes is an opaque region or a semi-transparent region.

12. The method as claimed in claim 8, wherein the photoresist layer and the test photoresist layer on the semiconductor substrate have the same material, the same thickness, and the same processing conditions.

* * * * *